(12) United States Patent
Reiners et al.

(10) Patent No.: US 7,287,506 B1
(45) Date of Patent: Oct. 30, 2007

(54) THERMOELECTRIC SYSTEM

(75) Inventors: Eric A. Reiners, Washington, IL (US); Mahmoud A. Taher, Peoria, IL (US); Dong Fei, Peoria, IL (US); Andrew N. McGilvray, East Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 11/520,107

(22) Filed: Sep. 13, 2006

(51) Int. Cl.
 *F02F 1/42* (2006.01)
(52) U.S. Cl. .............................. 123/193.5; 123/41.82 R
(58) Field of Classification Search ............ 123/195 R, 123/41.82 R, 193.5
 See application file for complete search history.

(56) References Cited

U.S. PATENT DOCUMENTS

| | | | |
|---|---|---|---|
| 4,148,192 A | 4/1979 | Cummings | |
| 4,653,443 A * | 3/1987 | Fukazawa et al. | 123/145 A |
| 4,753,682 A | 6/1988 | Contonie | |
| 6,029,620 A | 2/2000 | Zinke | |
| 2003/0234008 A1 | 12/2003 | Van Winkle | |
| 2004/0045594 A1 | 3/2004 | Hightower | |
| 2004/0221577 A1 | 11/2004 | Yamaguchi et al. | |
| 2005/0172993 A1 | 8/2005 | Shimoji et al. | |
| 2005/0263176 A1 | 12/2005 | Yamaguchi et al. | |
| 2005/0268955 A1 | 12/2005 | Meyerkord et al. | |
| 2006/0000651 A1 | 1/2006 | Stabler | |
| 2006/0048809 A1 | 3/2006 | Onvural | |

FOREIGN PATENT DOCUMENTS

JP            63111268 A  *  5/1988

* cited by examiner

*Primary Examiner*—Noah P. Kamen
(74) *Attorney, Agent, or Firm*—Liell & McNeil

(57) ABSTRACT

In one particular embodiment, an internal combustion engine is provided. The engine comprises a block, a head, a piston, a combustion chamber defined by the block, the piston, and the head, and at least one thermoelectric device positioned between the combustion chamber and the head. In this particular embodiment, the thermoelectric device is in direct contact with the combustion chamber. In another particular embodiment, a cylinder head configured to sit atop a cylinder bank of an internal combustion engine is provided. The cylinder head comprises a cooling channel configured to receive cooling fluid, valve seats configured for receiving intake and exhaust valves, and thermoelectric devices positioned around the valve seats.

20 Claims, 4 Drawing Sheets

THERMOELECTRIC SYSTEM

U.S. GOVERNMENT RIGHTS

This invention was made with government support under the terms of DE-FC26-04NT42280 awarded by the Department of Energy. The government may have certain rights in this invention.

TECHNICAL FIELD

The present disclosure relates to a thermoelectric system for generating electrical power. In particular, the present disclosure relates to thermoelectric devices disposed within the head of an internal combustion engine.

BACKGROUND

Internal combustion engines have become an integral component of many cultures throughout the world, providing a means of transportation and power generation while improving people's work productivity, generally. Over the years, researchers have improved many aspects of engine technology. Despite these many advances, unfortunately, engines only operate at about 50% efficiency or lower.

Poor engine efficiency is largely attributable to thermal energy lost during the combustion process. Much of this waste heat is conducted through various engine components and transferred to the environment, providing no useful work whatsoever.

In an effort to improve the efficiency of combustion engines, researchers have developed ways to convert some of the waste heat into useful energy. For example, some researchers have converted waste heat into useful electrical energy that can be used to supplement a portion of the engine's electrical loads.

One such way is disclosed in U.S. Pat. No. 6,029,620 to Zinke ("Zinke"). Zinke discloses an engine block containing thermoelectric materials that generate a direct current during operation and, in so doing, provides for at least some of the necessary engine cooling requirements and for at least some of the electric power requirements. Zinke discloses manufacturing internal combustion engines out of thermocouple-type materials. Zinke also discloses attaching thermoelectric modules to the exterior of an engine for minimizing the redesign of internal engine components.

Thermoelectric devices may either convert electrical energy into thermal energy or thermal energy into electrical energy. Early 19th century scientist Thomas Seebeck discovered the phenomenon of placing a temperature gradient across the junctions of two dissimilar conductors resulted in the flow of electrical current.

The engines disclosed in Zinke, unfortunately, fail in several respects. First, thermoelectric materials do not generally share the same material characteristics as the iron alloys used in engine block and head castings. As a result, an engine composed entirely of thermoelectric materials may exceed design limitations or fail to be robust enough for practical use. Additionally, the cost of thermoelectric materials is generally considerably higher than those of iron alloys. As a result, an engine composed entirely of thermoelectric materials would be prohibitively expensive.

Furthermore, Zinke fails to disclose precise locations for placing these thermoelectric materials. Zinke simply discloses either making an engine entirely out of thermoelectric materials or, in the alternative, generally attaching thermoelectric materials to the engine block. Simply attaching thermoelectric materials to an engine block, without anything further, fails to provide a practical solution for recovering waste heat.

The present disclosure is aimed at overcoming one or more of the shortcomings set forth above.

SUMMARY OF THE INVENTION

In one particular embodiment, an internal combustion engine is provided. The engine comprises a block, a head, a piston, a combustion chamber defined by the block, the piston, and the head, and at least one thermoelectric device positioned between the combustion chamber and the head. In this particular embodiment, the thermoelectric device is in direct contact with the combustion chamber.

In another particular embodiment, a cylinder head configured to sit atop a cylinder bank of an internal combustion engine is provided. The cylinder head comprises a cooling channel configured to receive cooling fluid, valve seats adapted to receive intake valves and exhaust valves, and thermoelectric devices positioned around the valve seats.

DETAILED DESCRIPTION

Figure 1:
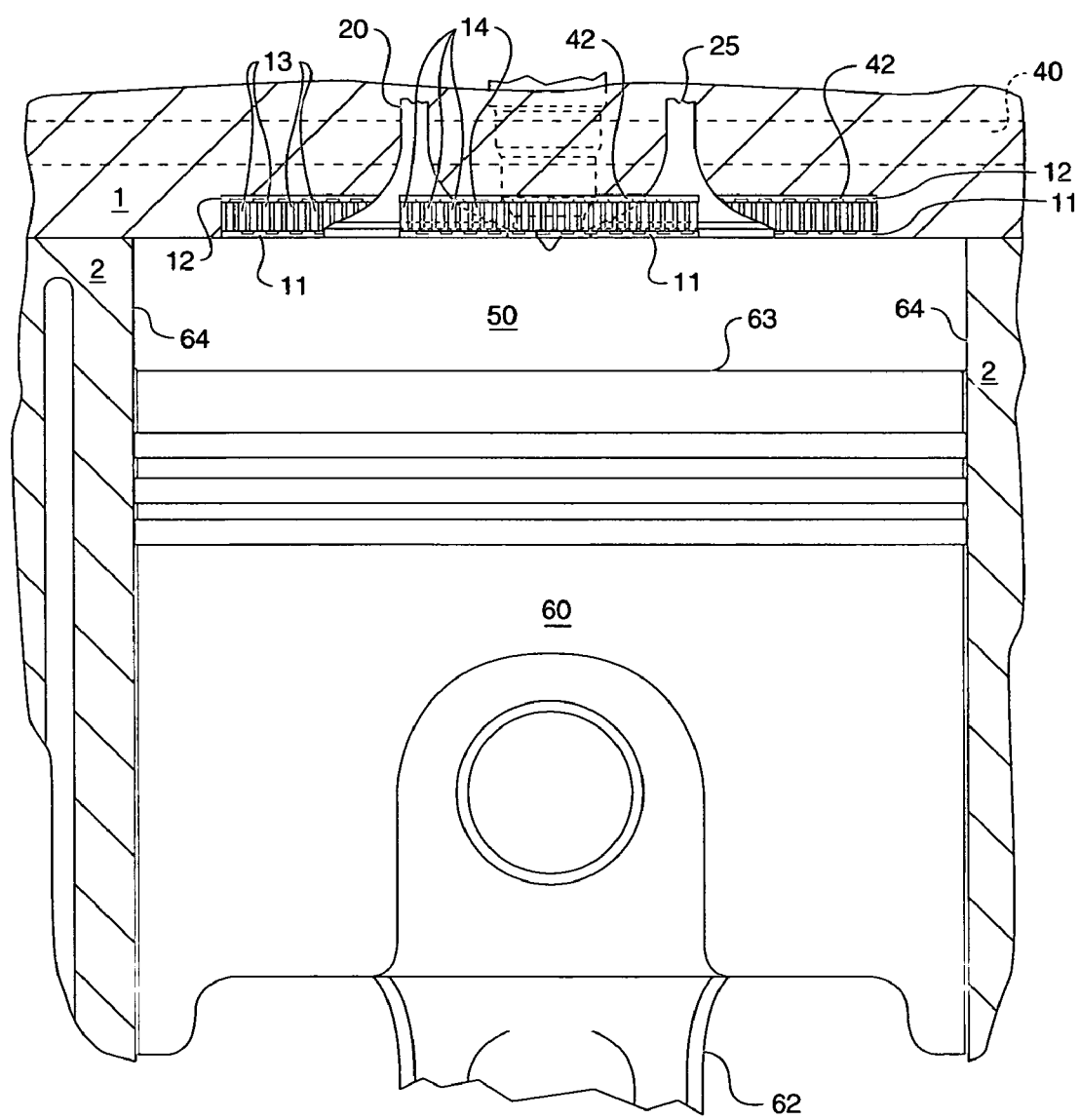
FIG. 1 is a diagrammatic illustration of a thermoelectric device arrangement according to an exemplary embodiment of the disclosure.

FIG. 1 provides a diagrammatic illustration of thermoelectric devices 10 positioned within a cylinder head 1 of an internal combustion engine.

In the particular embodiment of FIG. 1, the engine is a reciprocating-piston internal combustion engine, with piston 60 that reciprocates within a cylinder 64 formed within engine block 2. A combustion chamber 50 is defined by topside 63 of piston 60, bottom side of head 1, and cylinder 64 formed within engine block 2. Combustion of a fuel and air mixture occurs within combustion chamber 50, generating high temperatures as a result of the heat release associated with the combustion. Much of this heat is thermally transferred to head 1, piston 60, and block 2.

The heat transferred to these components generally performs no useful work and consequently decreases the overall efficiency of the engine. In an effort to improve this efficiency, thermoelectric devices 10 are arranged within cylinder head 1. These thermoelectric devices 10 convert some of this wasted heat energy into useful electrical energy, which can later be used to supplement the engine's electrical loads, for example.

As previously mentioned, electrical energy is produced from thermal energy under the phenomenon known as the Seebeck effect.

When a temperature gradient is imposed on a conductor under open circuit conditions—that is, no current is allowed to flow—a steady-state potential difference between the high- and low-temperature regions is created. In a closed circuit, on the other hand, electrical current will flow as long as the temperature gradient is maintained. The power density produced by this temperature gradient is proportional to the temperature gradient and defined by the following equation:

$$Q'' = \frac{\lambda \Delta T}{L}$$

Q″ defines power density, or power per unit area. L defines the distance between hot surface 11 and cold surface 12 (see FIG. 4) and A defines the thermal conductivity of thermoelectric device 10. As can be seen, the larger the temperature gradient, the larger the power generated.

This disclosure proposes positioning thermoelectric devices 10 within head 1 of engine so that devices 10 are located between two areas with a large thermal gradient, such as between engine coolant 40 and combustion chamber 50. Between these locations, a large temperature gradient is generally observed. In some instances, this temperature gradient may be as high as 650° C.

The Figure of Merit, ZT, of a material at a given temperature T is used to describe the material's performance or effectiveness when used in thermoelectric device 10. The Figure of Merit is defined by the following equation:

$$ZT = \frac{S^2 T}{RK}$$

S defines the Seebeck coefficient of thermoelectric device 10, R defines the electrical resistance of thermoelectric device 10, K defines the thermal conductance of the material, and T defines the temperature. The higher the Figure of Merit, the better the performance of thermoelectric device 10. In some embodiments of the present disclosure, the Figure of Merit is at least three. Nanostructured boron carbide, for example, is a material that exhibits a Figure of Merit of at least three and at the temperatures commonly associated with internal combustion engine operation.

Figure 3:
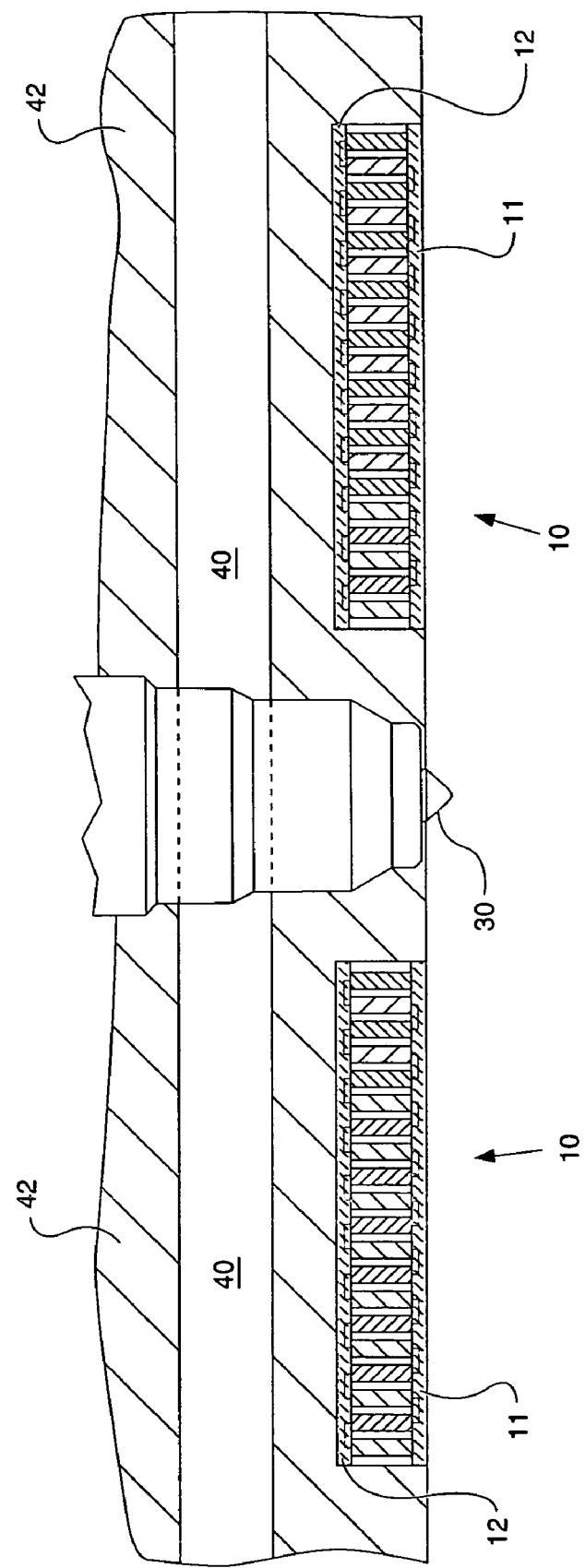
FIG. 3 is a cross-sectional view of the diagrammatic illustration of FIG. 2.
Figure 4:
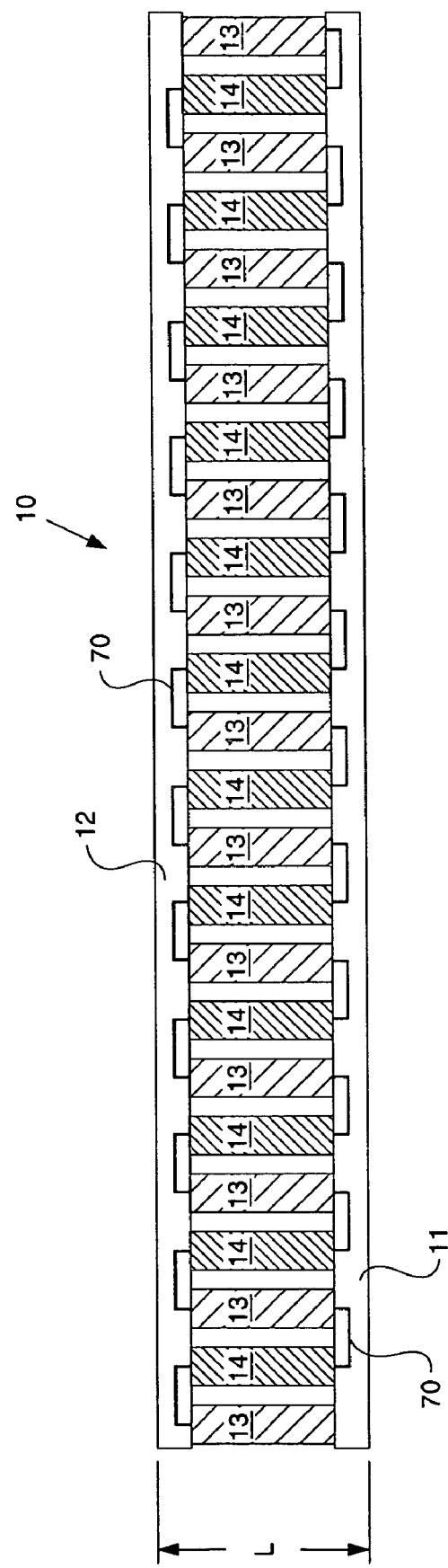
FIG. 4 is a cross-sectional view of a thermoelectric device according to one particular embodiment of the disclosure.

Now referring to FIG. 4, a particular embodiment of thermoelectric device 10 is shown. The reader should appreciate that the present disclosure is not limited to the particular thermoelectric device 10 shown in FIGS. 1-4. Instead, one skilled in the art would understand that several different types of thermoelectric devices 10 might alternatively be used to carry out the invention of the present disclosure.

The particular thermoelectric device 10 of FIGS. 1-4 comprises two ceramic substrates that serve as a foundation and electrical insulation for P-type semiconductors 14 and N-type semiconductors 13. These semiconductors 13 and 14 are connected electrically in series and thermally in parallel between the ceramics. The ceramic substrates also serve as insulation between the internal electrical elements. In this particular embodiment, a heat sink is in contact with hot side 11 and a cooler surface is in contact with cold side 12. An electrically conductive material—such as conducting pads attached to P-type semiconductors 14 and N-type semiconductors 13—maintain electrical connections inside device 10. Solder or any other known fixing technique may be used at the connection joints to enhance the electrical connections and hold device 10 together.

In some embodiments, P-type semiconductors 14 comprise compounds or boron and/or silicon. N-type semiconductors 13, on the other hand, may comprise SiC or SiGe, for example.

In some embodiments, electrical leads 70 to the device 10 are attached to pads on the hot side 11 of device 10. Leads 70 may then be connected to a DC battery, DC loads, or a DC-AC inverter for powering any AC loads, for example. The reader should appreciate that as electrical power is generated, its application may go towards any useful means envisioned by one skilled in the art and is not limited to those listed above.

The particular embodiment of FIG. 1 depicts thermoelectric devices 10 positioned within head 1 so that a hot side 11 of thermoelectric devices 10 faces combustion chamber 50. The highest temperatures within an engine generally occur within combustion chamber 50, and can be as high as 750° C. or higher.

Additionally and as further depicted in the particular embodiment of FIG. 1, cold side 12 of thermoelectric device 10 faces away from combustion chamber 50 and faces towards cooling channel 40. In one particular embodiment, the cooling fluid in coolant channel 40 is engine jacket water that was just previously cooled by an engine cooler, such as a radiator. Because the electrical power generated by thermoelectric devices 10 is proportional to the temperature gradient, it is desirable to configure the engine's coolant system so that a cooler portion of the coolant flows through channel 40.

In the particular embodiment of FIG. 1, thermoelectric device 10 is separated from coolant channel 40 by metallic interface 42, which in this embodiment is integrally formed with head 1. Metallic interface 42 provides a high-pressure boundary separating combustion chamber 50 from channel 40 while at the same time providing a barrier to prevent thermoelectric device 10 from directly contacting coolant within channel 40.

In some instances, head 1 may be manufactured from a casting process. Cavities may be formed during the casting process to accommodate thermoelectric devices 10. Alternatively, cavities may be machined within head 1 to accommodate thermoelectric devices 10. Thermoelectric devices 10 may then be placed within the cavities so that devices 10 directly contact the combustion gases within combustion chamber 50. The reader should appreciate that the precise method of manufacturing these cavities is not germane to the disclosed embodiments and that one skilled in the art would understand that several methods might exist for manufacturing head 1 with cavities for accommodating devices 10.

During the manufacture of cylinder head 1, metallic interface 10 may also be formed integral with head 1 so that a high-pressure boundary exists to isolate combustion chamber 50—and thermoelectric devices 10—from coolant channel 40.

Figure 2:
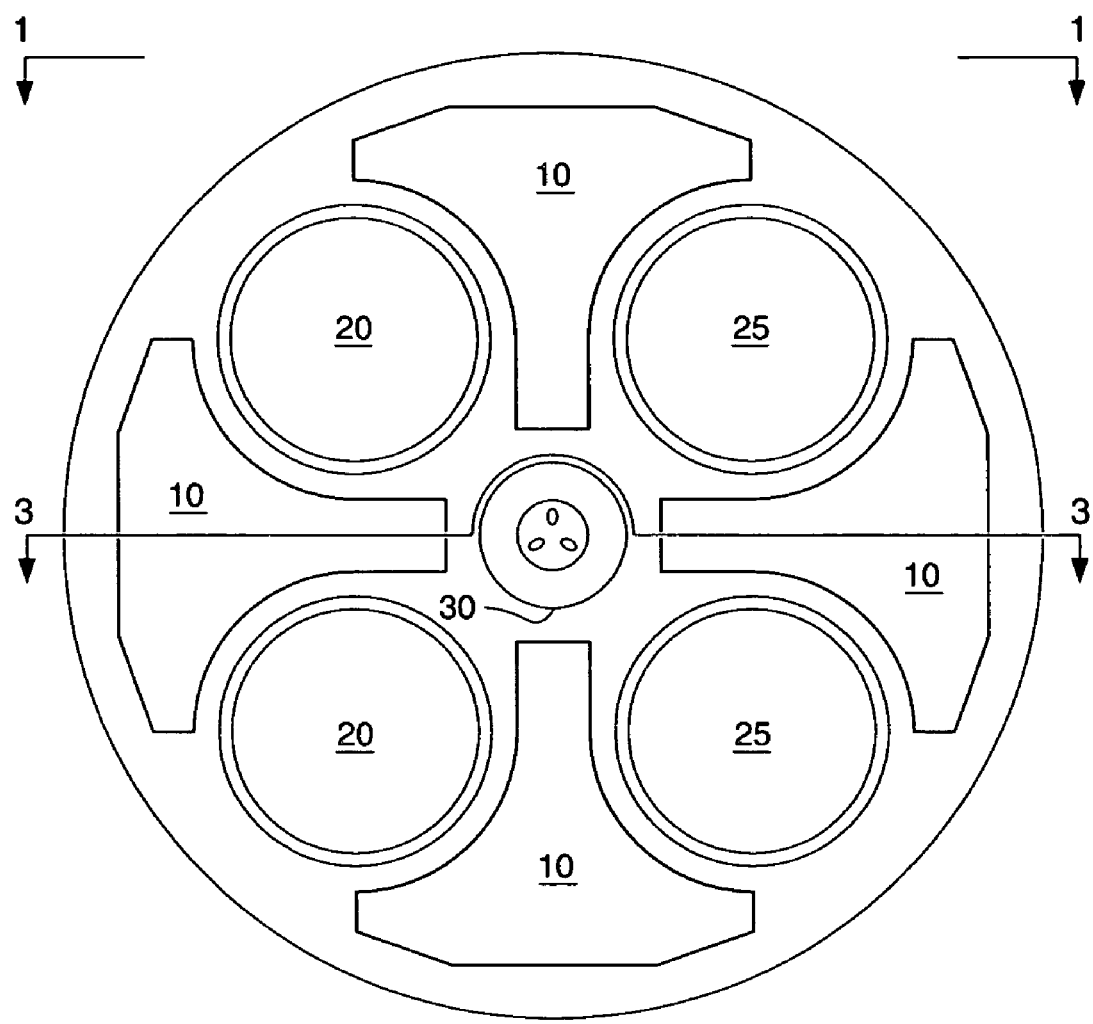
FIG. 2 is another diagrammatic illustration of a thermoelectric device arrangement according to an exemplary embodiment of the disclosure.

Now referring to FIG. 2, FIG. 2 provides a diagrammatic illustration of thermoelectric devices 10 positioned within an engine's head 1. The particular embodiment of FIG. 2 depicts four thermoelectric devices 10 positioned around two intake valves 20 and two exhaust valves 25. Many engines have two intake valves 20 and two exhaust valves 25 per cylinder 64. Although the particular embodiment of FIG. 2 depicts two intake valves 20 and two exhaust valves 25 per cylinder 64, the reader should appreciate that the present disclosure applies to engines with other valve configurations. In addition, although intake valves 20 and exhaust valves 25 are shown as having similar diameters, the reader should appreciate that many internal combustion engines have intake valves 20 and exhaust valves 25 with varying diameters and that the present disclosure would apply to these engines, as well.

In the particular embodiment disclosed in FIG. 2, thermoelectric devices 10 have a general "T" shape. This particular shape—when oriented according to FIG. 2—increases the surface area of thermoelectric devices 10 that is in contact with combustion chamber 50. This may allow for devices 10 to convert more waste heat to electrical energy. Fuel injector 30 (or spark plug) may be centrally located within cylinder 64, which when in the presence of two intake valves 20 and two exhaust valves 25, justifies the T-shape nature of the four thermoelectric devices 10.

Now referring to FIG. 3, FIG. 3 provides a cross-sectional view-along line I-I—of part of engine head 1 that is depicted in FIG. 2. As can be seen in the particular embodiment of FIG. 3, thermoelectric devices 10 have a hot side 11 and a cold side 12. In this particular embodiment, hot side 11 is in direct contact with combustion chamber 50 while cold side 12 faces cooling chamber 40. As can further be seen, a metallic interface 42 exists to separate cooling channel 40 from device 10. In the particular embodiment of FIG. 3, metallic interface 42 is integrally formed with head 1.

Now referring to FIG. 4, a particular embodiment of thermoelectric device 10 is shown.

A typical thermoelectric device 10 comprises of two ceramic substrates that serve as a foundation and electrical insulation for P-type 14 and N-type 13 semiconductors. Semiconductors 14 and 13 are connected electrically in series and thermally in parallel between the ceramics. The ceramic substrates may also serve as insulation between the internal electrical elements and a heat sink that may be in contact with hot side 11 as well as a cooler object against cold side 12. The electrical connections between P-type 14 and N-type 13 semiconductors may be achieved by the use of metallic leads 70—or tabs—which may comprise nickel or chromium. Nickel, for example, is a material with suitable conductivity and oxidation resistance.

In some particular embodiments, metallic leads 70 may be connected to the ends of each semiconductor 13 or 14 leg by a conductive material that is applied at room temperature. When set, the conductive material may be capable of withstanding the high temperatures associated with engine combustion.

The electrical power developed by the thermoelectric device 10 may then be transferred to the point of use by wires (not shown) or any other type of electrical conductor known in the art. Referring to FIG. 4, a first wire may connect the left-most semiconductor to the point of use and a second wire may connect the right-most semiconductor to the point of use, which may be an electrical battery or load. As a temperature gradient is viewed across device 10, an electrical potential will be generated and seen across the first and second wires.

INDUSTRIAL APPLICABILITY

The present disclosure provides a system and method for recovering waste heat from an internal combustion engine for converting it to useful electrical energy. Internal combustion engines convert chemical energy into useful work by the combustion of a fuel and air mixture.

Referring to the particular embodiment of FIG. 1, during combustion of a fuel and air mixture within combustion chamber 50, heat is released causing the temperature within chamber 50 to rise. In some instances, the temperature may be as high as 750° C. The combustion gases are then used to drive piston 60 and connecting rod 62 down (as seen in FIG. 1)—thus rotating a crankshaft (not shown) for the purpose of performing mechanical work.

Unfortunately, not all of the combusted fuel and air is converted into useful mechanical work. Some of the heat from the combustion process is thermally transferred to various engine components, such as head 1, block 2, and the exhaust system (not shown). Much of the thermal energy is wasted as it transfers to the environment.

The disclosed system transfers some of this thermal energy to hot side 11 of device 10. In one particular embodiment, hot side 111 of device 10 is in direct contact with combustion chamber 50, thus being exposed to the high temperatures resultant from the combustion process.

At the same time, engine coolant flows through channel 40. This relatively cool coolant is in close proximity to cold side 12 ceramic of device 10 and is generally cooler than hot side 11. In some embodiments, this coolant may have just exited the engine's jacket-water cooler or radiator. As a result, a temperature gradient is imposed across device 10.

As long as this temperature gradient is maintained, electrical current will flow. This electrical current may then be used to supplement a vehicle's electrical loads, charge a battery, or perform any other function requiring electricity.

In one particular embodiment, the electrical energy generated is used support the electrical load of a hybrid machine. Hybrid vehicles and machines typically have a combustion engine and electric motor mechanically linked to a drive train for providing propulsion. In this particular embodiment, the electrical energy generated by device 10 would help power an electric motor, which when mechanically linked to a drive train, provides propulsion to the machine.

It will be apparent to those skilled in the art that various modifications and variations can be made with respect to the embodiments disclosed herein without departing from the scope of the disclosure. Other embodiments of the disclosed invention will be apparent to those skilled in the art from consideration of the specification and practice of the materials disclosed herein. It is intended that the specification and examples be considered as exemplary only, with a true scope of the disclosure being indicated by the following claims and their equivalents.

What is claimed is:

1. An internal combustion engine, comprising:
   a block;
   a head;
   a piston;
   a combustion chamber defined by the block, the piston, and the head; and
   at least one thermoelectric device positioned within the head,
   in which the thermoelectric device is in direct contact with the combustion chamber.

2. The engine of claim 1, further comprising a cooling system configured to provide cooling fluid to the head via a coolant channel; and
   the thermoelectric device is separated from the coolant channel by a portion of the head.

3. The engine of claim 2, in which the thermoelectric device is positioned between the cooling system and the combustion chamber in a cavity formed in the head.

4. The engine of claim 3, in which the thermoelectric device comprises a cold side and a hot side, said cold side facing the cooling system.

5. The engine of claim 4, in which the cooling system facing the cold side is from a downstream side of the engine's radiator.

6. The engine of claim 1, in which the thermoelectric device comprises a compound of boron or silicon, and is separated from a coolant channel by a high-pressure metallic boundary.

7. The engine of claim 1, in which the electrical energy supplements the engine's electrical loads.

8. The engine of claim 1, in which the thermoelectric device comprises a material with a thermoelectric figure of merit of three or higher.

9. A hybrid machine, comprising:
an electric motor;
the engine of claim 1, said engine providing at least some electrical energy to said electrical motor; and
a drive train mechanically-linked to the motor and engine and adapted to provide propulsion to the machine.

10. An internal combustion engine, comprising:
a block;
a head;
a piston;
a combustion chamber defined by the block, the piston, and the head;
at least one thermoelectric device positioned between the combustion chamber and the head;
in which the thermoelectric device is in direct contact with the combustion chamber; and
the thermoelectric device comprises a cold side and a hot side, said cold side is in direct contact to the head and said hot side is in direct contact with the combustion chamber.

11. An internal combustion engine, comprising:
a block;
a head;
a piston;
a combustion chamber defined by the block, the piston, and the head; and
at least one thermoelectric device positioned between the combustion chamber and the head;
in which the thermoelectric device is in direct contact with the combustion chamber;
a cooling system configured to provide cooling fluid to the head;
the thermoelectric device is positioned between the cooling system and the combustion chamber;
the thermoelectric device comprises a cold side and a hot side, said cold side facing the cooling system;
the cooling system facing the cold side is from a downstream side of the engine's radiator; and
the cooling system is separated from the cold side of the thermoelectric device by a metallic interface integrally formed within the head.

12. An internal combustion engine, comprising:
a block;
a head;
a piston;
a combustion chamber defined by the block, the piston, and the head;
at least one thermoelectric device positioned between the combustion chamber and the head;
in which the thermoelectric device is in direct contact with the combustion chamber;
four engine valves and four thermoelectric devices, said four thermoelectric devices positioned around the four engine valves.

13. An internal combustion engine, comprising:
a block;
a head;
a piston;
a combustion chamber defined by the block, the piston, and the head;
at least one thermoelectric device positioned between the combustion chamber and the head,
in which the thermoelectric device is in direct contact with the combustion chamber; and
the thermoelectric device comprises a substantially T-shape.

14. A cylinder head configured to sit atop a cylinder bank within an internal combustion engine, comprising:
a cooling channel configured to receive cooling fluid;
valve seats adapted to receive intake valves and exhaust valves; and
thermoelectric devices positioned around the valve seats.

15. The cylinder head of claim 14, in which the thermoelectric devices comprise boron or silicon.

16. The cylinder head of claim 14, in which the thermoelectric devices comprise a hot side and a cold side, said hot side facing away from the cooling channel and said cold side facing towards the cooling channel.

17. The cylinder head of claim 14, in which the thermoelectric devices comprise a thermoelectric figure of merit of three or higher.

18. The cylinder head of claim 14, in which the engine head comprises two intake valve seats and two exhaust valve seats per engine cylinder.

19. The cylinder head of claim 18, further comprising four thermoelectric devices per engine cylinder.

20. The cylinder head of claim 14, in which the thermoelectric devices are substantially T-shaped.

* * * * *

UNITED STATES PATENT AND TRADEMARK OFFICE
CERTIFICATE OF CORRECTION

PATENT NO. : 7,287,506 B1
APPLICATION NO. : 11/520107
DATED : October 30, 2007
INVENTOR(S) : Reiners et al.

It is certified that error appears in the above-identified patent and that said Letters Patent is hereby corrected as shown below:

In Column 3, Line 10, delete "A" and insert -- $\lambda$ --, therefor.

In Column 6, Line 9, delete "111" and insert -- 11 --, therefor.

Signed and Sealed this

Fifth Day of August, 2008

JON W. DUDAS
*Director of the United States Patent and Trademark Office*